United States Patent [19]
Tachi et al.

[11] Patent Number: 5,643,473
[45] Date of Patent: *Jul. 1, 1997

[54] DRY ETCHING METHOD

[75] Inventors: Shinichi Tachi, Sayama; Kazunori Tsujimoto, Higashiyamato; Sadayuki Okudaira, Ome; Kiichiro Mukai, Hachioji, all of Japan

[73] Assignee: Hitachi, Ltd., Tokyo, Japan

[*] Notice: The term of this patent shall not extend beyond the expiration date of Pat. No. 5,147,500.

[21] Appl. No.: 453,336

[22] Filed: May 30, 1995

Related U.S. Application Data

[63] Continuation of Ser. No. 191,928, Feb. 4, 1994, abandoned, which is a continuation of Ser. No. 898,150, Jun. 15, 1992, abandoned, which is a continuation of Ser. No. 598,808, Oct. 10, 1990, Pat. No. 5,147,500, which is a continuation of Ser. No. 225,813, Jul. 29, 1988, abandoned.

[30] Foreign Application Priority Data

Jul. 31, 1987 [JP] Japan ................................ 62-190036

[51] Int. Cl.$^6$ .............................. H05H 1/00; H01L 21/00
[52] U.S. Cl. ................................................ 216/67
[58] Field of Search ........................... 216/67, 68, 69, 216/70, 71; 156/643.1, 646.1; 204/192.32, 192.35

[56] References Cited

U.S. PATENT DOCUMENTS

| | | | |
|---|---|---|---|
| 4,483,737 | 11/1984 | Mantei | 156/643.1 |
| 4,496,448 | 1/1985 | Tai et al. | 156/643 X |
| 4,640,737 | 2/1987 | Nagasaka et al. | 156/646 X |
| 5,147,500 | 9/1992 | Tachi et al. | 156/643 |

FOREIGN PATENT DOCUMENTS 158627  8/1985  Japan .

*Primary Examiner*—Thi Dang
*Attorney, Agent, or Firm*—Antonelli, Terry, Stout & Kraus, LLP

[57] ABSTRACT

A dry etching method is disclosed, in which the pressure of etching gas in a reaction chamber, the bias voltage applied to article to be etched, and the temperature of the article to be etched object are set so that the etching rate for the article to be etched is greater than 0.2 μm/min, a ratio of the length of side etching in the article to be etched to the depth of etching therein is less than 1/100, and a ratio of the etching rate for the article to be etched to the etching rate for a mask formed thereon is greater than 10. Thus, the dry etching method can satisfy three requirements (that is, a high etching rate, a high selection ratio and marked anisotropy in etching) at the same time, although conventional dry etching methods can satisfy only two of three requirements.

11 Claims, 5 Drawing Sheets

F I G. 1
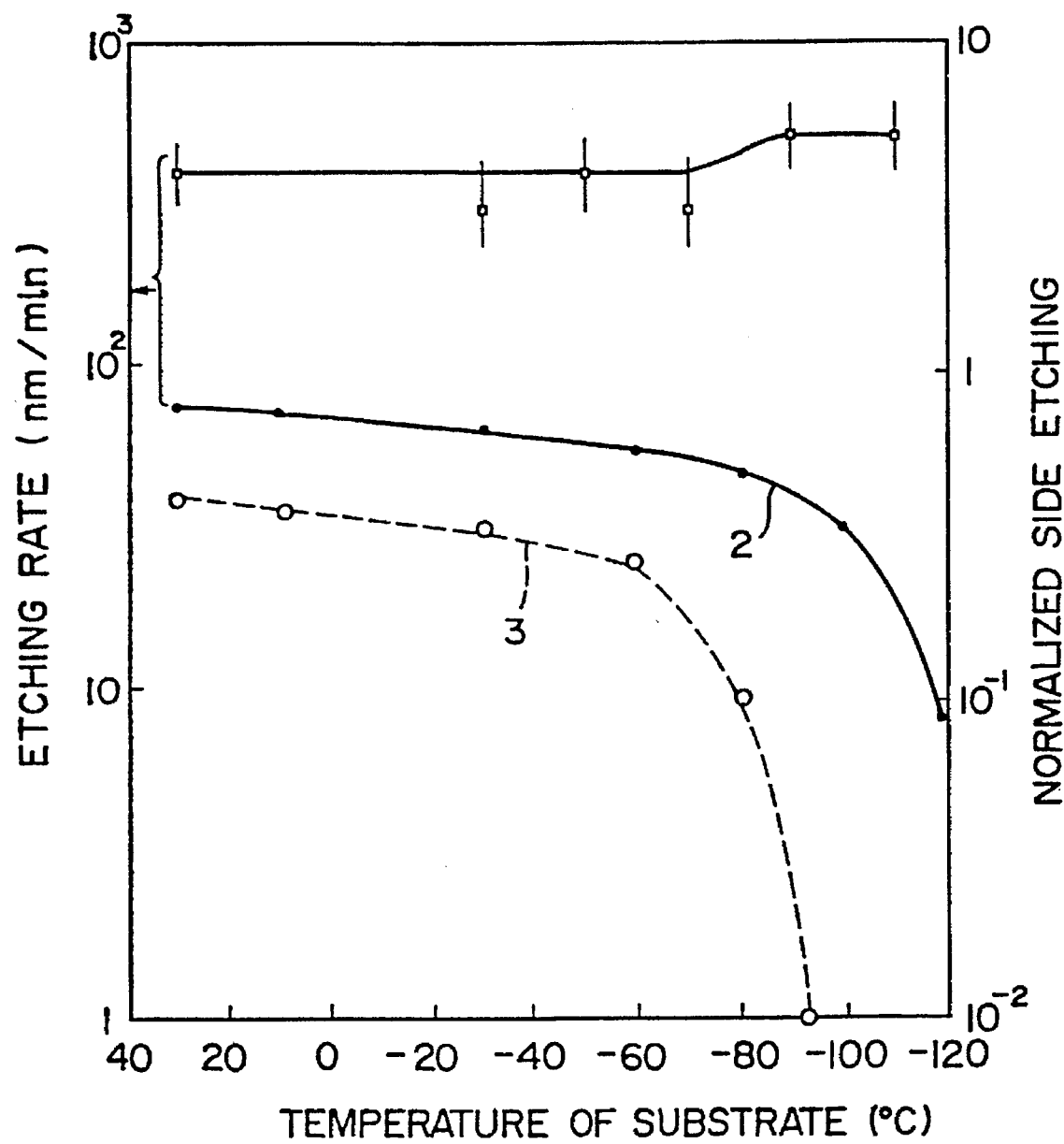

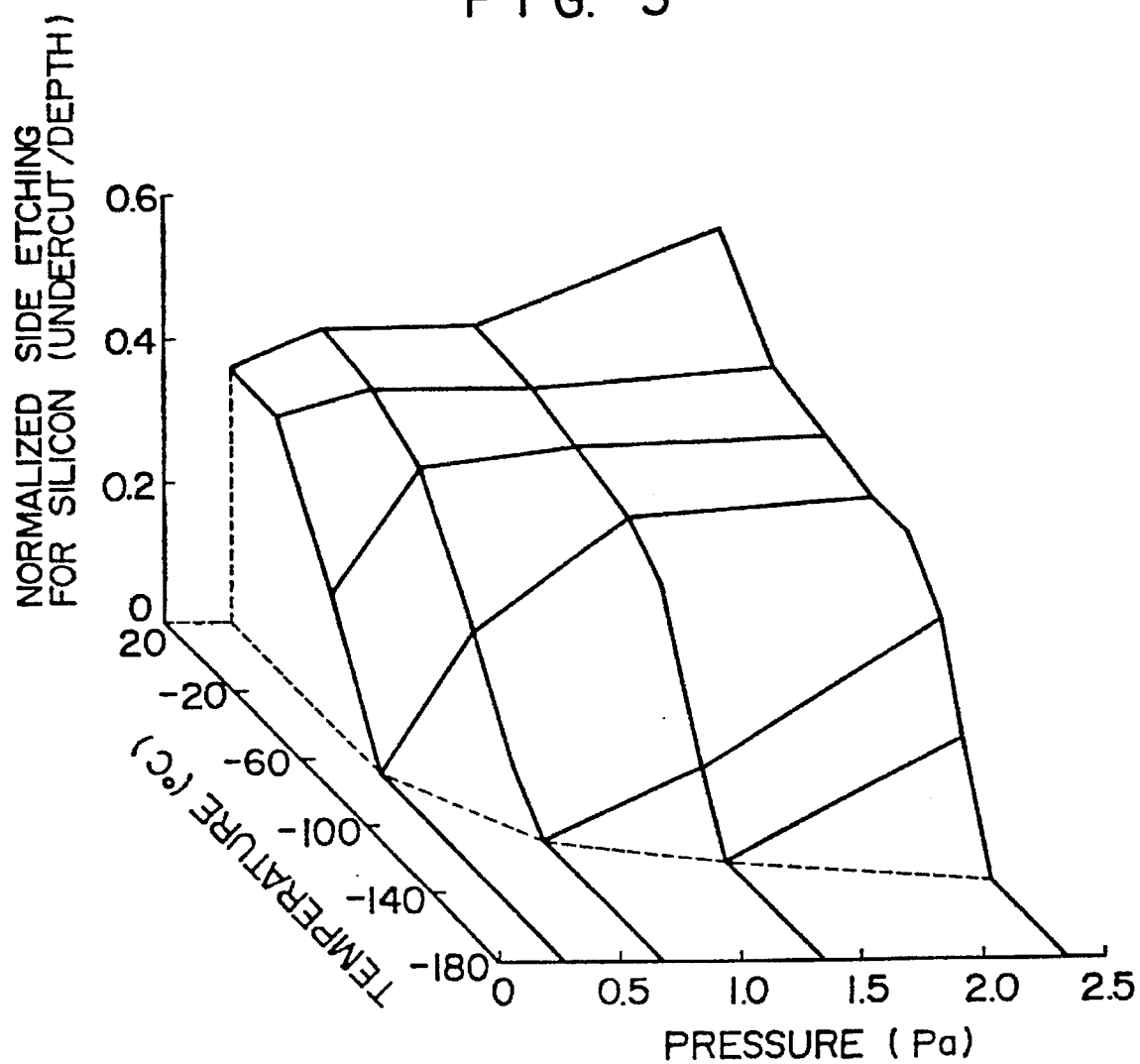
F I G. 3

DRY ETCHING METHOD

This is a continuation of application Ser. No. 08/191,928, filed Feb. 4, 1994, now abandoned, which is a continuation of application Ser. No. 07/898,150, filed Jun. 15, 1992, now abandoned, which is a continuation application Ser. No. 07/598,808, filed Oct. 10, 1990, now U.S. Pat. No. 5,547,500, which is a continuation of application Ser. No. 07/225,813, filed Jul. 29, 1988, now abandoned.

BACKGROUND OF THE INVENTION

The present invention relates to a dry etching method, and more particularly, to a dry etching method capable of etching an article to be etched at a high rate and in exact accordance with a mask pattern.

The improvements in etching rate, selectivity and anisotropy of dry etching are described in the Proc. Dry Process Symp., 1986, page 42, the Proc. Dry Process Symp., 1986, page 83 and the Proc. Dry Process Symp., 1984, page 121, respectively, and are further described in many other publications. A dry etching method capable of satisfying two of three requirements (a high etching rate, high selectivity and marked anisotropy) is disclosed in, for example, a Japanese Patent Application JP-A-60-158,627. Further, a low-temperature dry etching method has been proposed.

However, conventional dry etching methods cannot satisfy the above-mentioned three requirements at the same time, but satisfy only one or two of the requirements. For example, in a conventional method, the etching rate is as high as 0.5 μm/min and a ratio of the length of side etching to the etching depth is less than 1/100, but a selection ratio (that is, a ratio of the etching rate for an article to be etched to that for a mask material) is less than 5. Accordingly, the mask may be etched off in the course of an etching operation. In order to solve this problem, it is required to form a mask of an etching resistant film, for example, an $SiO_2$ film. In this case, a manufacturing process is very complicated. Further, in another conventional method, the etching rate for an article to be etched is greater than 0.5 μm/min and a ratio of the etching rate for the article to be etched to that for a mask material is greater than 10, but the length of side etching increases. Accordingly, a pattern formed in the article to be etched deviates from a mask pattern by 0.1 to 0.2 μm, and such a deviation makes a large scale integration circuit defective. In a further conventional method, a ratio of the length of side etching to the etching depth and a ratio of the etching rate for the article to be etched to that for a mask material are both high, but the etching rate for the article to be etched is as low as about 0.1 μm/min. Accordingly, it takes a very long time, for example, to form a deep groove in a silicon substrate by dry etching.

SUMMARY OF THE INVENTION

It is an object of the present invention to provide a dry etching method which can satisfy three requirements for dry etching (that is, a high etching rate, high selectivity and marked anisotropy) at the same time to solve the difficulties of conventional methods.

In order to attain the above object, according to the present invention, there is provided a dry etching method in which dry etching is carried out in such a manner that an etching gas which does not contain carbon and silicon and does not deposit a film on the article to be etched, is kept at a pressure higher than the pressure of etching gas used in conventional anisotropic etching, each of a bias voltage applied to the article to be etched and electric power supplied to the etching gas is put in a predetermined range, and the temperature of the article to be etched is so set as to obtain marked anisotropy in etching the article to be etched and to make an etching rate for a mask material less than one-half an etching rate for the mask material at 20° C.

BRIEF DESCRIPTION OF THE DRAWINGS

FIG. 1 is a graph for explaining an embodiment of a dry etching method according to the present invention.

FIGS. 2 to 4 are graphs for explaining another embodiment of a dry etching method according to the present invention.

DESCRIPTION OF THE PREFERRED EMBODIMENTS

Figure 2:
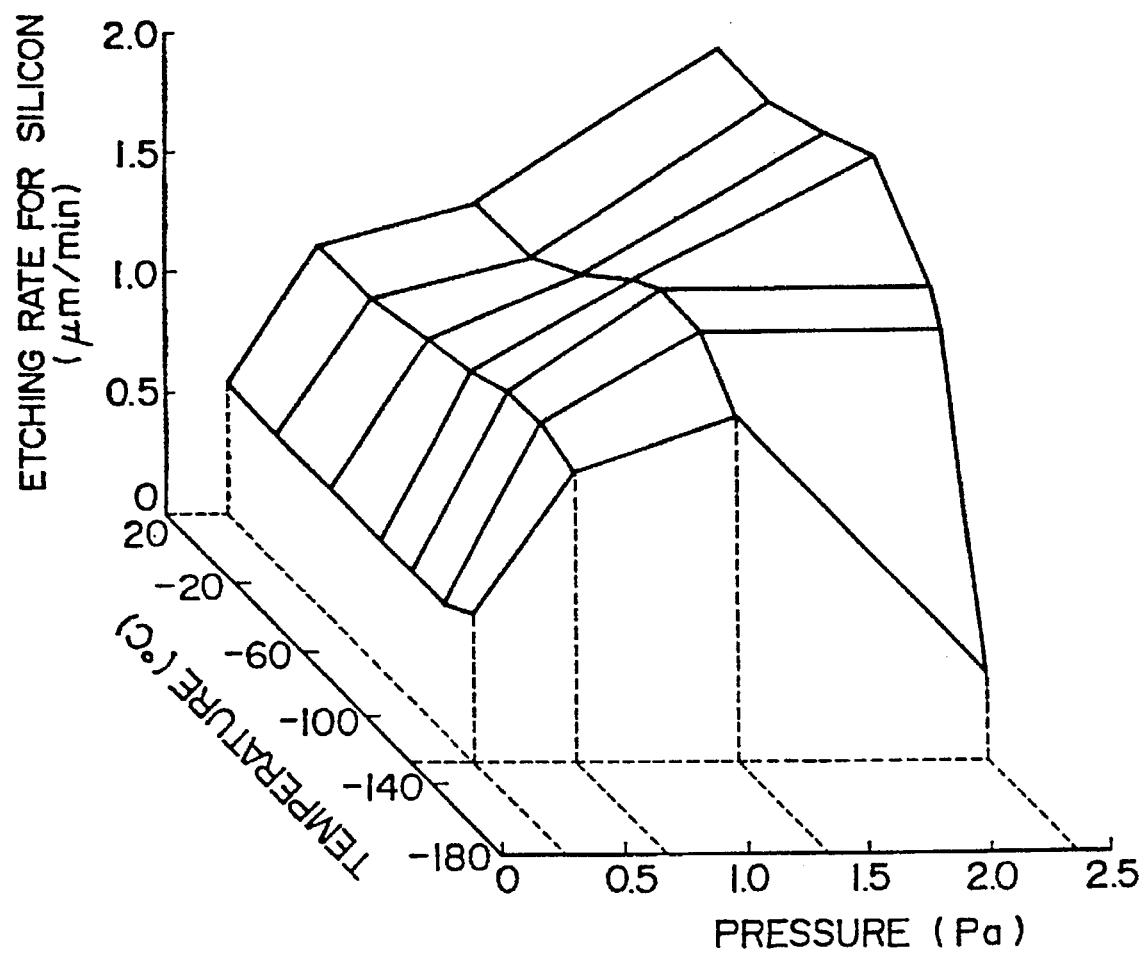

When the pressure of etching gas in a reaction chamber of the etching apparatus is made higher than an ordinary gas pressure used in carrying out anisotropic etching, and a gas which does not contain carbon and silicon so as not to deposit a film (that is, a film containing carbon or silicon) on the article to be etched in an etching process, is used as an etching gas, ions and radicals resulting from the etching gas are not consumed for removing the deposited film, and moreover the pressure of the etching gas is high. Accordingly, the etching rate the article to be etched is for higher than an etching rate obtained in a case where a gas which contains carbon and silicon and thus produces the deposit on the article to be etched, is used as the etching gas. For example, in a case where an $SF_6$ gas is used as the etching gas, an etching rate for silicon is greater than 0.5 μm/min. Further, when the pressure of an etching gas is made higher than an ordinary gas pressure used in carrying out anisotropic etching and each of a bias voltage applied to the article to be etched and electric power supplied to the etching gas is put in a predetermined range shown in the following TABLE I, a ratio of the etching rate for the article to be etched to that for a mask material is greatly increased, that is, the selectivity in an etching process is greatly improved. Furthermore, when the temperature of the article to be etched is put in a predetermined range shown in the following TABLE I to make a ratio of the length of side etching to the etching depth less than 1/100 and to make at etching rate for a mask material less than one-half an etching rate for the mask material at 20° C., the anisotropy in etching is greatly improved and the selectivity in an etching process is further improved.

Etching conditions used in the present invention are summarized in the following TABLE I.

TABLE I

| | Etching method | | |
|---|---|---|---|
| Item | Reactive ion etching | Microwave plasma etching | Magnetron discharge type reactive etching |
| Gas pressure (m Torr) | 60 to 100 | 4 to 10 | 4 to 10 |
| Bias voltage (V) | −100 to −30 | −50 to −10 | −50 to −10 |
| Electric power | 0.2 to 0.4 (W/cm$^2$) | 200 to 400 (W) | 0.2 to 0.4 (W) |
| Temperature (°C.) | −90 to −135 | −100 to −135 | −100 to −135 |

By using the etching conditions shown in the TABLE I, we can obtain, for example, favorable results shown in the following TABLE II.

TABLE II

| | Etching method | | |
|---|---|---|---|
| Item | Reactive ion etching | Microwave plasma etching | Magnetron discharge type reactive etching |
| Etching rate (μm/min) | >0.5 | >1 | >1 |
| Selection ratio for silicon and silicon and photo-resist material | >10 | >10 | >10 |
| Anisotropy ratio of length of side etching to etching depth | <1/100 | <1/100 | <1/100 |

The TABLE II shows the results obtained in a case where silicon is etched by using an $SF_6$ gas as an etching gas. In other cases, favorable results similar to those shown in the TABLE II were obtained by using the etching conditions shown in the TABLE I.

EMBODIMENT I

FIG. 1 shows experimental results obtained in a case where a substrate made of monocrystalline silicon was subjected to reactive ion etching using an $SF_6$ gas plasma, under conditions that input power was equal to 450 W, and a gas pressure was equal to 65 m Torr. In FIG. 1, a solid curve 1 indicates a relationship between the temperature of the silicon substrate and the etching rate for the silicon substrate in the direction of the depth therein, a solid curve 2 indicates a relationship between the temperature of the silicon substrate and the etching rate for a photoresist film for forming a mask pattern, and a broken curve 3 indicate a relationship between the temperature of the silicon substrate and the normalized side etching. The term "normalized side etching" means a ratio of the length of side etching measured from the edge of a mask pattern to the etching depth. When the temperature of the silicon substrate was made lower than −90° C. and a self-bias voltage of −100 V was applied to the silicon substrate, the etching rate for the photoresist film became less than one-half an etching rate for the photoresist film at 20° C. and the normalized side etching became less than $10^{-2}$. Further, it was confirmed that a bias voltage of −10 to −100 V was required for making the selection ratio (namely, a ratio of the etching rate for the silicon substrate to that for the photoresist film) greater than ten. Further, even when the temperature of the silicon substrate was made lower than −80° C., the etching rate for the silicon substrate in the direction depth therein was in the order of 5,000 Å/min, that is, was substantially equal to an etching rate at 20° C., and the silicon substrate was etched at high speed so long as the gas pressure was made higher than 60 m Torr. Thus, in the present embodiment, dry etching was carried out under conditions that the input power was 450 W, the temperature of the silicon substrate was made lower than −90° C., the gas pressure was made higher than 60 m Torr and the bias voltage applied to the silicon substrate was put in a range from −100 to −10 V, to obtain a high etching rate for the silicon substrate and a selection ratio of 10 or more, and to increase the degree of anisotropy in etching. The etching rate for the silicon substrate could be varied by changing the pressure of the $SF_6$ gas and the input power. Further, it was confirmed that when dry etching was carried out under conditions shown in the TABLE I, all of three requirements (that is, a high etching rate, high selectivity and marked anisotropy) were satisfied.

EMBODIMENT II

In the present embodiment, microwave plasma etching or magnetron discharge type reactive etching was carried out in accordance with the present invention.

Figure 4:
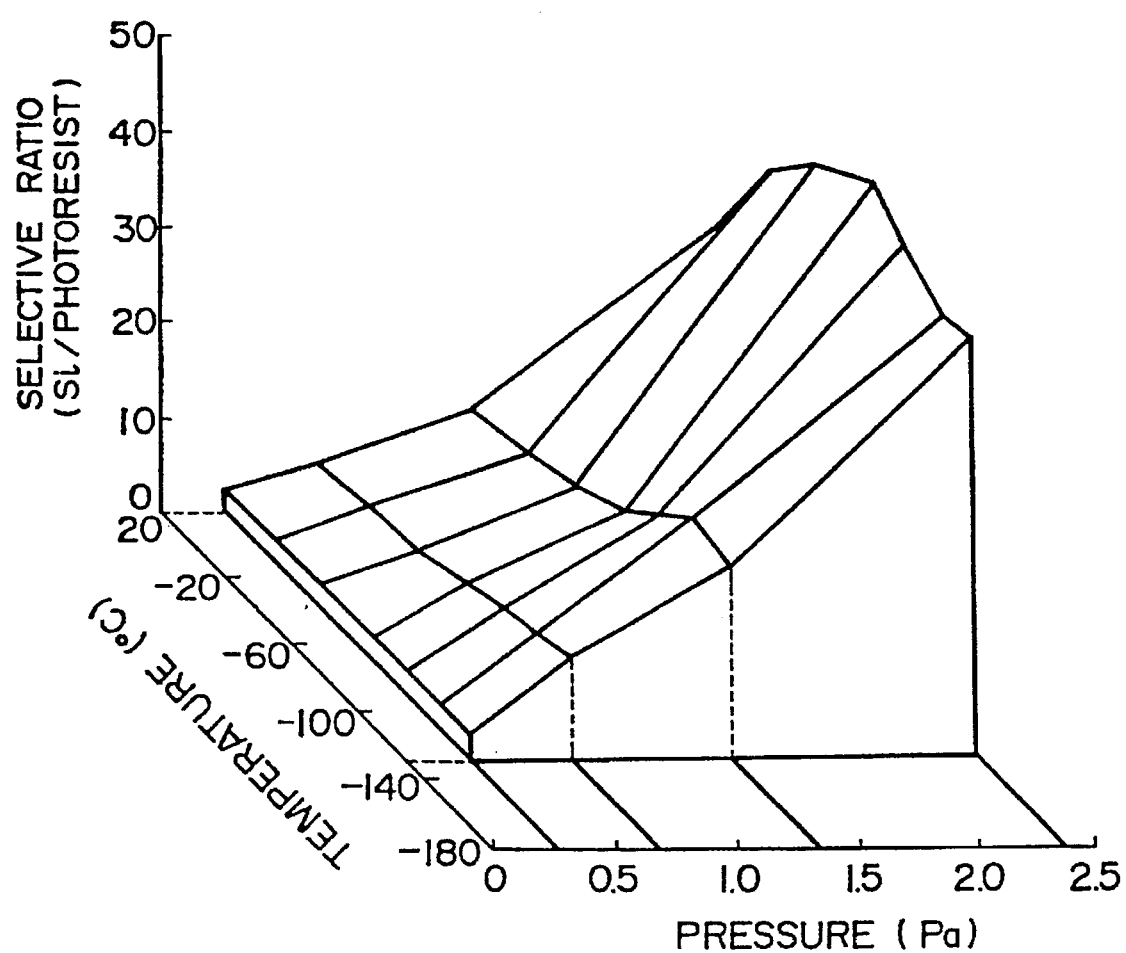

An $SF_6$ gas was used as an etching gas, to etch a polysilicon film kept at various temperatures within a range from +20° C. to −140° C. by the microwave plasma etching method. FIGS. 2, 3 and 4 show a relationship between the pressure of the $SF_6$ gas and the etching rate for the polysilicon film, a relationship between the pressure of the $SF_6$ gas and the normalized side etching (namely, a ratio of the length of side etching to the etching depth), and a relationship between the pressure of the $SF_6$ gas and the selection ratio (namely, a ratio of the etching rate for the polysilicon film to that for a photoresist film), respectively. In the above etching process, a microwave power of 200 W was supplied to the $SF_6$ gas, and a vias voltage of −50 to −10 V was applied to the polysilicon film. As is apparent from FIGS. 2, 3 and 4, when the pressure of the $SF_6$ gas was made higher than 4 m Torr and the temperature of the polysilicon film was put in a range from −100° C. to −135° C. the etching rate was higher than 1 μm /min, the side etching was nearly equal to zero, and the selection ratio was greater than 10. Further, in a case where the above polysilicon film was etched by the magnetron discharge type reactive etching method, favorable results similar to the above-mentioned were obtained.

EMBODIMENT III

In the present embodiment, an $NF_3$ gas was used as an etching gas to etch a silicon substrate by the microwave plasma etching method or magnetron discharge type reactive etching method. When the temperature of the silicon substrate was made lower than −120° C., the pressure of the $NF_3$ gas was made higher than 1 m Torr, a bias voltage of −40 to −5 V was applied to the silicon substrate and an electric power of 250 W was supplied to the $NF_3$ gas, the etching rate for the silicon substrate became greater than 5,000 Å/min, a ratio of the etching rate for the silicon substrate to that for a photoresist mask became greater than ten, and the normalized side etching became less than $10^{-2}$.

In a case where a $PF_3$ gas was used in place of the $NF_3$ gas, it was required to make the temperature of the silicon substrate lower than −90° C. Further, in a case where an $F_2$ gas was used in place of the $NF_3$ gas, high-accuracy etching was carried out by making the temperature of the silicon substrate lower than −90° C.

In all of the above cases, favorable results were obtained by using the etching conditions shown in the TABLE I.

EMBODIMENT IV

A $Cl_2$ gas was used as an etching gas to etch a silicon substrate by the microwave plasma etching method or magnetron discharge type reactive etching method. In this case, when the temperature of the silicon substrate was made lower than −60° C., the pressure of the $Cl_2$ gas was made higher than 4 Torr and a bias voltage of −20 to −100 V was applied to the silicon substrate, the etching rate for the silicon substrate became greater than 0.5 μm/min, a ratio of the etching rate for the silicon substrate to that for a photoresist film became greater than ten, and the normalized side etching became less than $10^{-2}$. Further, a $Cl_2$ gas was used as an etching gas to etch a silicon substrate by the reactive ion etching method. In this case, when the pressure of the $Cl_2$ gas was made nearly equal to 100 m Torr, an electric power of 200 W was supplied to the $Cl_2$ gas, a bias voltage of −200 V was applied to the silicon substrate and the temperature of the silicon substrate was made lower than −50° C., favorable results were obtained. In a case where a $Br_2$ gas was used in place of the $Cl_2$ gas, high-accuracy etching was carried out by making the temperature of the silicon substrate lower than −40° C.

In the above, the $Cl_2$ or $Br_2$ gas was used as an etching gas. However, an etching operation excellent in working accuracy can be performed by using a mixture of a plurality of gases (for example, a mixture of $SF_6$ and $Cl_2$ or a mixture of $NF_3$ and $Cl_2$) as an etching gas. It was confirmed that the selection ratio was improved by changing the pressure and mixing ratio of a gas mixture used as an etching gas, with time.

EMBODIMENT V

Figure 5:
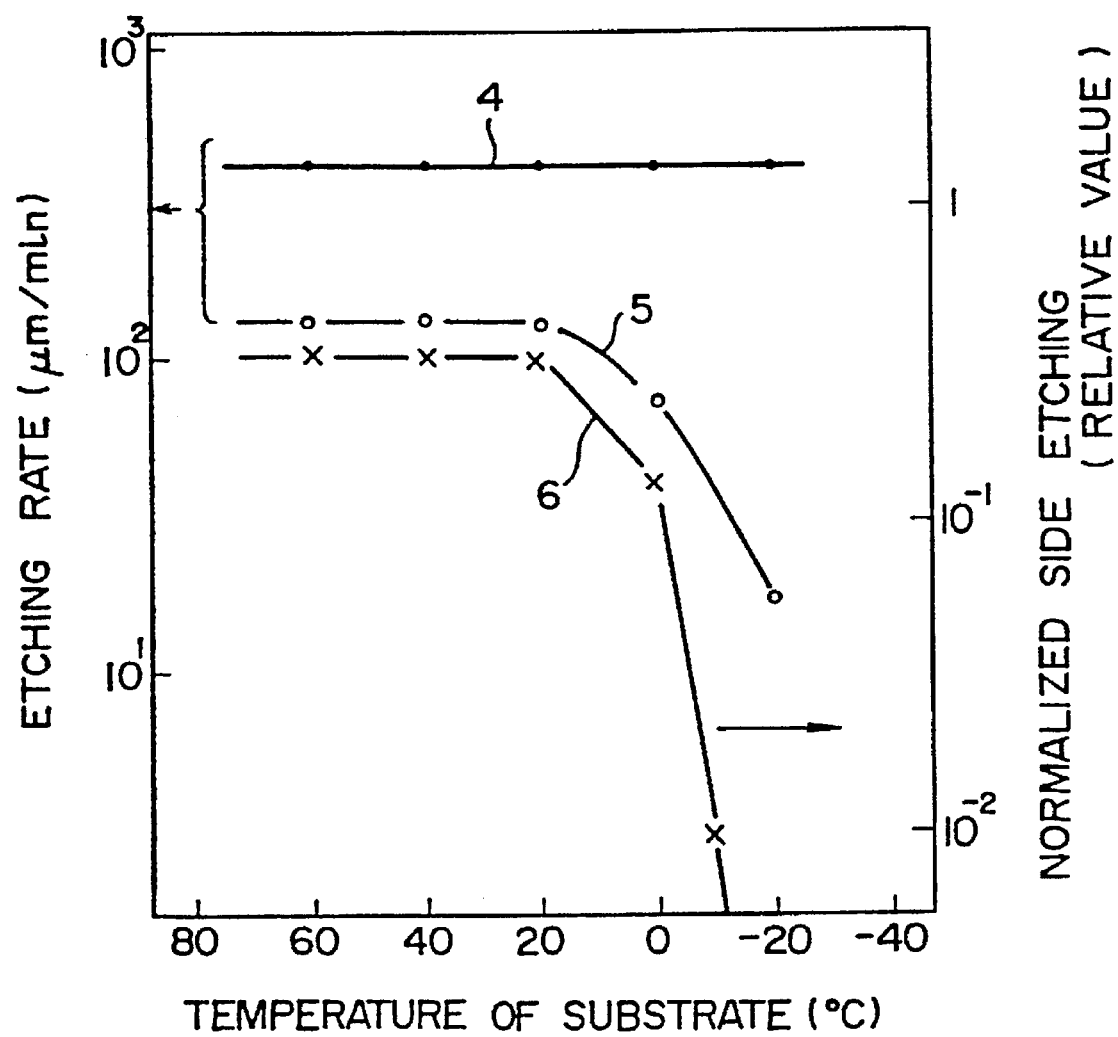
FIG. 5 is a graph for explaining a further embodiment of a dry etching method according to the present invention.

FIG. 5 shows experimental results which were obtained in a case where an aluminum film kept at various temperatures within a range from −20° C. to 80° C. was etched by a reactive ion etching method using a $Cl_2$ gas as an etching gas, under conditions that the pressure of the $Cl_2$ gas was made equal to 200 m Torr, an electric power of 400 W was supplied to the $Cl_2$ gas and a bias voltage smaller than −200 V was applied to the aluminum film. In FIG. 5, a straight line 4 indicates a relationship between the temperature of the Al film and the etching rate for the Al film, a curve 5 indicate a relationship between the temperature of the Al film and the etching rate for a resist film formed on the Al film, and a curve 5 indicates a relationship between the temperature of the Al film and the normalized side etching. The etching of aluminum is accompanied with an exothermic reaction, and hence aluminum is heated to a temperature of 40° to 100° C. even when aluminum is etched while being cooled by cooling water. In the present embodiment, the etching rate for the Al film was 5,500 Å/min in a temperature range from −20° C. to +80° C. as indicated by the straight line 4 in FIG. 5. When the temperature of the Al film was made equal to −5° C., the etching rate for the resist film became less than one-half the etching rate for the resist film in a case where the Al film was cooled by cooling water, as indicated by the curve 5 in FIG. 5. Further, when the temperature of the Al film was made equal to −10° C., the normalized side etching was reduced to $10^{-2}$. Thus, it was confirmed that when an Al film was etched by the reactive ion etching method using a $Cl_2$ gas under conditions that the temperature of the Al film was made lower than −10° C. the pressure of the $Cl_2$ gas was put in a range from 50 to 200 m Torr and a bias voltage smaller than −200 V was applied to the Al film, the working accuracy in etching was greatly improved.

In a case where a $BCl_3$ gas was used in place of the $Cl_2$ gas, the etching rate for the Al film was reduced by about 50%. However, owing to the boron deposition effect, the normalized side etching was reduced to $10^{-2}$, even when the temperature of the Al film was kept at −5° C. That is, when the $BCl_3$ gas is used, high-accuracy etching can be carried out under an etching condition that the Al film is kept at −5° C.

EMBODIMENT VI

A film made of aluminum or an aluminum alloy was etched by the microwave plasma etching method and the magnetron discharge type reactive etching method each using a $BCl_3$ gas or $Cl_2$ gas as an etching gas, under conditions that the pressure of the etching gas was made higher than 2 m Torr, a bias voltage smaller than −50 V was used and the temperature of the film was made lower than −5° C. In this case, the etching rate was greater than 1 µm /min, the selection ratio (namely, a ratio of the etching rate for the Al or Al-alloy film to that for a resist film) was greater than ten, and the normalized side etching was less than $10^{-2}$. The above etching rate for the Al or Al-alloy film was more than twice the etching rate in the reactive ion etching method. That is, it was known that when aluminum or an aluminum alloy was etched by a dry etching method, the microwave plasma etching method and the magnetron discharge type reactive etching method were superior to the reactive ion etching method.

EMBODIMENT VII

A tungsten film was etched while using a resist film as a mask by the microwave plasma etching method or magnetron discharge type reactive etching method under conditions that an $SF_6$ gas was used as an etching gas, the pressure of the $SF_6$ gas was made equal to 5 m Torr and a microwave power of 300 W was supplied to the $SF_6$ gas. In this case, when the temperature of the tungsten film was made lower than 0° C. favorable results were obtained. Further, the etching rate for the tungsten film increased as the radio-frequency power was larger, and favorable microwave plasma etching was carried out by putting the pressure of the $SF_6$ in a range from 5 to 20 m Torr and making the bias voltage smaller than −40 V. That is, when the tungsten film was etched by the microwave plasma etching method or magnetron discharge type reactive etching method under conditions that the pressure of the $SF_6$ gas was made higher than 5 m Torr, the radio-frequency power was so increased as to make the bias voltage smaller than −40 V, and the temperature of the tungsten film was made lower than 0° C., the etching rate for the tungsten film became higher than 1 µm /min, the selection ratio became greater than ten, and the normalized side etching was reduced by a great degree.

EMBODIMENT VIII

When fluorocarbon gases such as $C_3F_8$, $C_2F_6$, and $CHF_3$ are used as an etching gas to etch $SiO_2$ and $Si_3N_4$, these gases do not produce a deposit on $SiO_2$ and $Si_3N_4$. However, when these gases are used to etch silicon and tungsten, a deposit is produced on silicon and tungsten. In more detail, when the fluorocarbon gases are used to etch $SiO_2$, $SiO_2$ reacts with $CF_2$, and reaction products $SiF_4$ and CO (or $CO_2$) evaporate. Accordingly, a deposit containing carbon or a monomer $CF_n$ is not produced.

An $SiO_2$ film was etched by the microwave plasma etching method using a $CHF_3$ gas as an etching gas, under conditions that the pressure of the $CHF_3$ gas was made equal to 2 m Torr and an electric power of 400 W was supplied to the $CHF_3$ gas. In this case, the etching rate for the $SiO_2$ film was 5,000 Å/min. In order to make the normalized side etching less than $10^{-2}$ and make a ratio of the etching rate for the $SiO_2$ film to that for a resist film greater than 15, while keeping an etching rate of 5,000 Å/min, it was necessary to make the temperature of the $SiO_2$ lower than −60° C. In the above etching process, a bias voltage of −100 V was applied to the $SiO_2$ film. In a case where a bias voltage smaller than −100 V was used, the etching rate for the $SiO_2$ film was reduced, and it was necessary to put the temperature of the $SiO_2$ film in a range from −50° C. to −40° C. In a case where one of fluorocarbon gases such as $C_2F_6$ and $C_3F_8$ or a gas mixture of one of the fluorocarbon gases and helium was used as an etching gas to etch an $SiO_2$ film by the microwave plasma etching method, when the pressure of the etching gas was made higher than 2 m Torr, a bias voltage smaller than −100 V was applied to the $SiO_2$ film and the temperature of the $SiO_2$ film was made lower than −40° C., both a high etching rate and a high selective ratio were obtained, and moreover the normalized side etching was reduced to a very small value.

When an $Si_3N_4$ film was etched by the microwave plasma etching method using one of the fluorocarbon gases $CHF_3$, $C_2F_6$ and $C_3F_8$ or a gas mixture $CF_4+O_2$ as an etching gas under conditions that the pressure of the etching gas was made higher than 2 m Torr, a bias voltage smaller than −100 V was applied to the $Si_3N_4$ film and the temperature of the $Si_3N_4$ film was made lower than −40° C., favorable results were obtained.

EMBODIMENT IX

An etching gas suitable for etching a silicide film made of one of $WSi_2$, $CoSi_2$, $TaSi_2$ and others, and a temperature of the silicide film were studied, and it was confirmed that the etching gas for and the temperature range of the silicide film were substantially the same as an etching gas for and a temperature range of a monocrystalline or polycrystalline silicon film. In more detail, when an $SF_6$ gas was used as an etching gas, it was required to make the temperature of the silicide film lower than −90° C. When a $Cl_2$ gas was used as an etching gas, it was required to make the temperature of the silicide film lower than −60° C. Similarly to a case where the monocrystalline or polycrystalline silicon film was etched, the pressure of the etching gas was required to be higher than 5 m Torr. Further, it was favorable to apply a self-bias voltage smaller than −50 V to the silicide film.

EMBODIMENT X

A gas containing chloride was used as an etching gas to etch GaAs under conditions that the pressure of the etching gas was made higher than 2 m Torr, a bias voltage smaller than −50 V was applied to the article to be etched and the temperature thereof was made lower than 0° C. In this case, favorable results were obtained.

It was possible to etch InP in a manner similar to the above-mentioned. In this case, however, it was necessary to keep the article to be etched at a temperature of 2° to 3° C.

Ternary compound semiconductors such as AlGaAs and InGaP were etched in substantially the same manner as mentioned above, and favorable results were obtained.

Further, superconductive materials such as Nb, Pb and Zr were etched in a similar manner. When an article to be etched was kept at a temperature lower than 5° C., the material was etched with a high accuracy.

The above-mentioned temperature ranges held in all of a parallel plate type reactive ion etching apparatus, a microwave plasma etching apparatus, a magnetron discharge type reactive etching apparatus, and other dry etching apparatuses using a plasma or an ion. Further, by selecting the gas pressure, the temperature of the article to be etched and the self-bias voltage applied thereto, appropriately in each of the above etching apparatuses, it was possible to make the etching rate for the article to be etched greater than 1 μm/min and to make the selection ratio greater than ten.

As is evident from the foregoing explanation, according to the present invention, various materials can be dry-etched with a high etching rate, a high selective ratio and marked anisotropy. That is, a dry etching method according to the present invention can reduce the number of manufacturing steps and the frequency of fault.

We claim:

1. A dry etching method comprising the steps of:

disposing an article to be etched in a reaction chamber of an etching apparatus, a mask having a pattern being formed on a surface of the article to be etched;

contacting the article to be etched with the plasma of an etching gas;

applying a bias voltage of a value to the article to be etched; and controlling the gas pressure in the reaction chamber, controlling the bias voltage applied to the article to be etched and controlling the temperature of the article to be etched to be lower than 20° C. to simultaneously (a) etch the article with an etching rate higher than 0.5 μm/min., (b) etch the article with a ratio of the etching rate for the article to be etched to the etching rate for the mask greater than ten, and (c) etch the article with a ratio of the length of the side etching in the article to be etched to the depth of etching in the article to be etched less than 1/100, wherein the etching apparatus is a microwave plasma etching apparatus and wherein the gas pressure is controlled to be in a range from 4 to 10 m Torr, the bias voltage is applied in a range from −10 to −50 V, and the temperature of the article to be etched is controlled to be in range from −100° to −135° C.

2. A dry etching method according to claim 1, wherein an electric power of 200 to 400 W is supplied to the microwave plasma etching apparatus.

3. A dry etching method according to claim 1, wherein said etching gas does not produce a deposit on the article to be etched.

4. A dry etching method comprising the steps of:

disposing an article to be etched in a reaction chamber of an etching apparatus, a mask made of a photoresist film having a pattern being formed on a surface of the article to be etched;

contacting the article to be etched with the plasma of an etching gas;

applying a bias voltage of a value to the article to be etched; and controlling the pressure of said etching gas, controlling the bias voltage in a range from −10 to −100 V and controlling the temperature of the article to be etched to be lower than 20° C. to simultaneously (a) etch the surface of the article at an etching rate higher than 0.5 μm/min., (b) etch the article with a ratio of the etching rate for the article to be etched to the etching rate for the mask greater than ten, and (c) etch the article with a ratio of the length of side etching in the article to be etched to the depth of etching in the article to be etched less than 1/100, wherein the etching apparatus is a microwave plasma etching apparatus, and wherein the gas pressure is controlled to be in a range from 4 to 10 m Torr, the bias voltage is controlled to be in a range from −10 to −50 V, and the temperature of the article to be etched is controlled to be in a range from −100° to −135° C.

5. A dry etching method according to claim 4, wherein an electric power of 200 to 400 W is supplied to the microwave plasma etching apparatus.

6. A dry etching method according to claim 4, wherein said etching gas does not produce a deposit on the article to be etched.

7. A dry etching method comprising steps of:

disposing an article to be etched in a reaction chamber of an etching apparatus, a mask having a pattern being formed on a surface of the article to be etched;

contacting the article to be etched with the plasma of an etching gas;

applying a bias voltage of a value to the article to be etched; and controlling the gas pressure in the reaction chamber, controlling the bias voltage applied to the article to be etched and controlling the temperature of the article to be etched to be lower than 20° C. to simultaneously (a) etch the article with an etching rate higher than 0.5 μm/min., (b) etch the article with a ratio of the etching rate for the article to be etched to the etching rate for the mask greater than ten, and (c) etch the article with a ratio of the length of the side etching in the article to be etched to the depth of etching in the article to be etched less than $\frac{1}{100}$, wherein the etching apparatus is a reactive ion etching apparatus, the gas pressure is controlled to be in a range from 60 to 100 mTorr, and the bias voltage of −30 to −100 V is applied to the article to be etched.

8. A dry etching method according to claim 7, wherein the temperature of the article to be etched is controlled to be lower than 0° C.

9. A dry etching method according to claim 7, wherein the temperature of the article to be etched is controlled to be lower than 0° C.

10. A dry etching method according to claim 7, wherein the mask comprises a patterned photoresist film.

11. A dry etching method according to claim 7, wherein the electric power is in a range of 0.2 to 0.4 W/cm$^2$.

* * * * *